US005671530A

United States Patent [19]
Combs et al.

[11] Patent Number: 5,671,530
[45] Date of Patent: Sep. 30, 1997

[54] FLIP-CHIP MOUNTING ASSEMBLY AND METHOD WITH VERTICAL WAFER FEEDER

[75] Inventors: Christopher David Combs, Wheeling, Ill.; Andrew Russell Baker, Kokomo, Ind.; Steven Lee Davidson, Carmel, Ind.; Thomas Rezsonya, Galveston, Ind.

[73] Assignee: Delco Electronics Corporation, Kokomo, Ind.

[21] Appl. No.: 550,262

[22] Filed: Oct. 30, 1995

[51] Int. Cl.⁶ .......................... H05K 3/30; H05K 13/02; H05K 13/04; H05K 13/08
[52] U.S. Cl. .......................... 29/834; 29/426.3; 29/426.4; 29/426.5; 29/703; 29/742; 29/743; 29/759; 29/760; 294/64.1; 414/225; 414/417; 414/737; 414/752; 414/938; 414/939; 901/40
[58] Field of Search .......................... 29/426.3, 426.4, 29/426.5, 703, 720, 740, 742, 743, 759, 760, 834, 840, DIG. 44; 198/345.2, 394; 221/1, 30; 228/180.22; 257/778; 269/21, 903; 294/2, 64.1; 414/225, 416, 417, 737, 752, 936, 938, 939, 941; 901/40

[56] References Cited

U.S. PATENT DOCUMENTS

| | | |
|---|---|---|
| 3,657,790 | 4/1972 | Larrison .......................... 29/742 X |
| 4,836,733 | 6/1989 | Hertel et al. .......................... 29/720 X |
| 4,915,565 | 4/1990 | Bond et al. .......................... 29/740 X |
| 4,955,775 | 9/1990 | Ohkase et al. .......................... 414/938 X |
| 5,090,609 | 2/1992 | Nakao et al. .......................... 228/180.22 |
| 5,180,273 | 1/1993 | Sakaya et al. .......................... 414/417 X |
| 5,193,972 | 3/1993 | Engelbrecht .......................... 414/752 |
| 5,319,846 | 6/1994 | Takahashi et al. .......................... 29/740 |

FOREIGN PATENT DOCUMENTS

| | | | |
|---|---|---|---|
| 161846 | 6/1989 | Japan .......................... | 414/938 |
| 253232 | 10/1989 | Japan .......................... | 414/938 |

*Primary Examiner*—Peter Vo
*Attorney, Agent, or Firm*—Jimmy L. Funke

[57] ABSTRACT

A vertical wafer compact flip chip feeder device includes a loading station for providing a loading location where a flip chip wafer having first and second planar surfaces is received such that the first and second planar surfaces are substantially perpendicular to a first plane. The flip chip feeder device further includes a pick-up station for providing a pick-up location where individual flip chips are retrieved from the flip chip wafer. A wafer translating assembly translates the flip chip wafer between the loading and pick-up stations with the first and second planar surfaces of the flip chip wafer remaining substantially perpendicular to the first plane. A chip pick-up assembly retrieves the individual flip chips from the flip chip wafer at the pick-up station and flips the individual flip chips to a flipped position such that first and second planar surfaces of the individual flip chips are substantially parallel with the first plane.

20 Claims, 13 Drawing Sheets

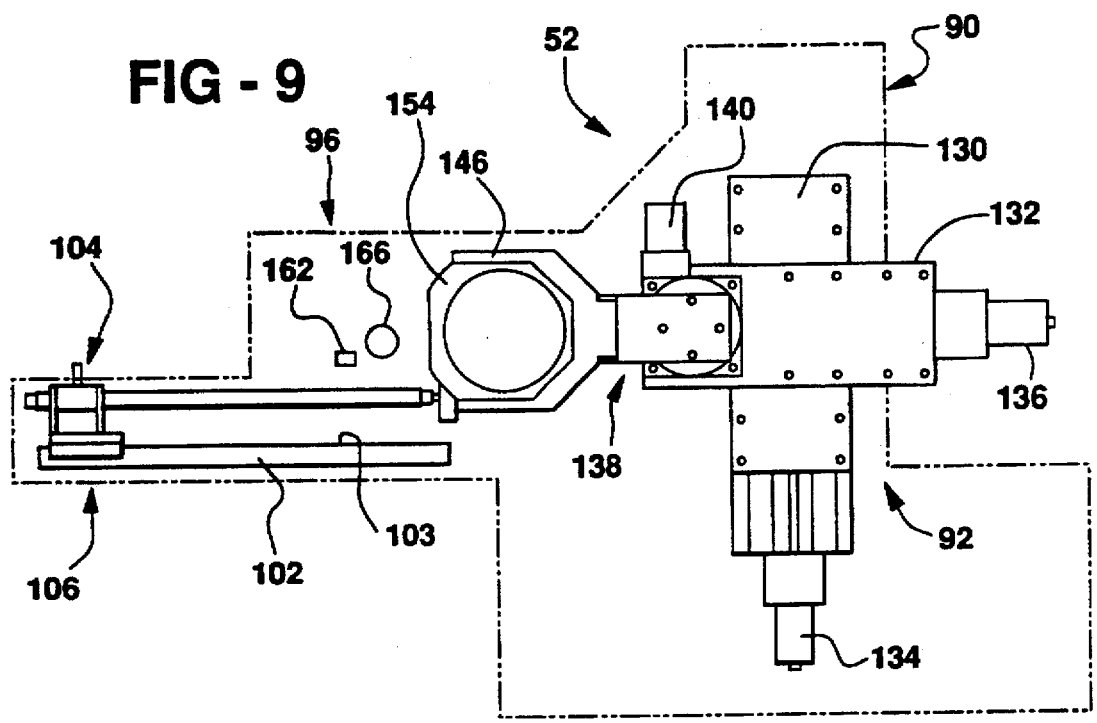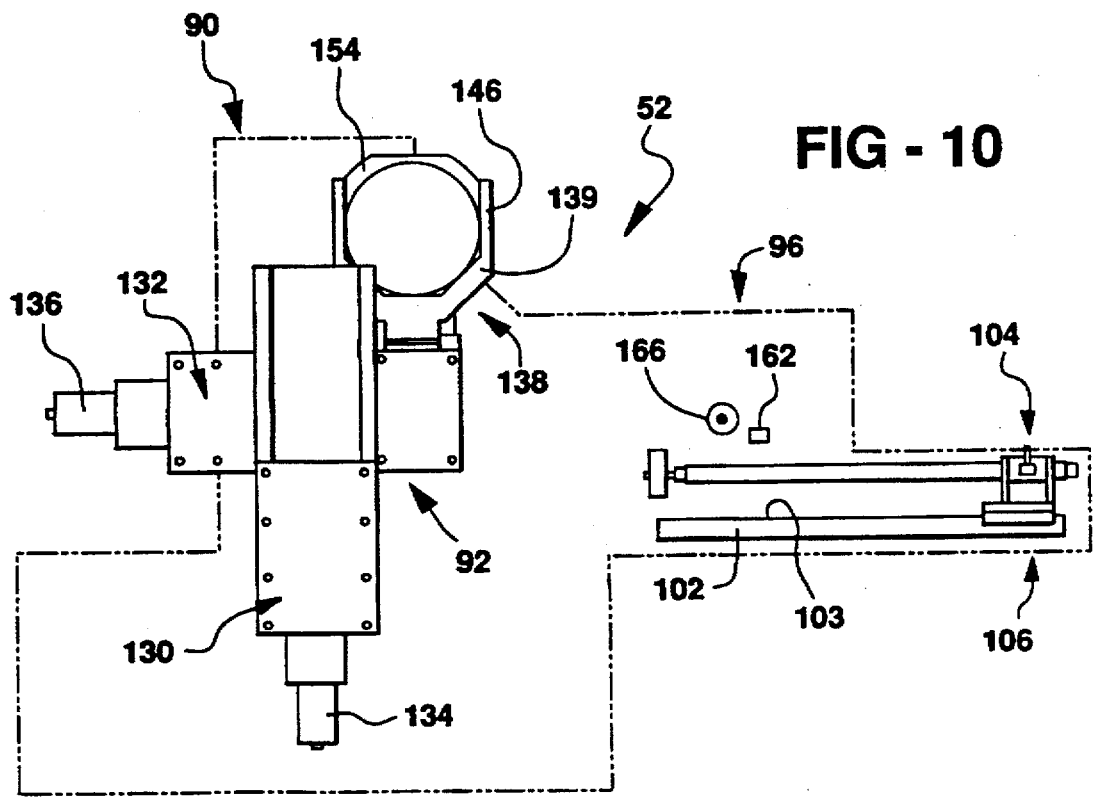

FLIP-CHIP MOUNTING ASSEMBLY AND METHOD WITH VERTICAL WAFER FEEDER

BACKGROUND OF THE INVENTION

1. Technical Field:

This invention relates generally to surface mounting of flip chip integrated circuits and, more particularly, to a vertical wafer compact flip chip feeder device that vertically positions a sawed flip chip wafer and removes the individual flip chips formed therein such that the individual flip chips are presented in a flipped position to a flip chip placement assembly.

2. Discussion:

Flip chip integrated circuits are commonly fabricated within a front face of a flip chip wafer that is subsequently scribed or sawed to remove the individual flip chips. The individual flip chips are commonly utilized in surface mounting applications wherein the flip chips are flipped into position for mounting to a top surface of a circuit board or a substrate having complementary circuitry formed therein. Each of the individual flip chips have contact pads or bumps formed on their front faces that are configured to correspond with the complementary circuitry formed within the top surface of the circuit board or substrate. The alignment of the individual flip chips upon the circuit board or substrate is critical due to the large number and reduced size of the contact pads or bumps.

Currently, integrated circuit chip feeder devices are commonly used in conjunction with pick and place type placement assemblies for surface mounting applications. Typically, reel type feeder devices are used to present individual flip chips to the pick and place type placement assemblies which in turn mount the flip chips to a circuit feeders require that the individual flip chips be removed from a flip chip wafer at a remote location from the feeders and aligned in series upon a feeder tape. The feeder tape is then used by a reel type feeder to present the individual flip chips to a flip chip placement assembly for mounting purposes. A common surface mounting application employs multiple reel type feeder stations that are configured to supply a variety of flip chips having different types of integrated circuits formed therein. A problem with past flip chip feeder devices is that they do not have the capability to directly remove individual flip chips from a sawed flip chip wafer and provide the flipping action required to present the flip chips to a flip chip placement assembly for mounting purposes. Additionally, such flip chip feeder devices take up a large amount of space which makes their use impractical in applications where space is critical.

It is therefore desirable to provide a flip chip feeder device that removes individual flip chips from a flip chip wafer and provides the flipping action required to present the individual flip chips to a flip chip placement assembly.

It is further desirable to provide a flip chip feeder device that maneuvers and positions a sawed flip chip wafer in a vertically orientated plane such that the space required to remove the flip chips from the flip chip wafer is minimized.

Yet, it is also desirable to provide a method for positioning a sawed flip chip wafer in a vertically orientated plane such that the wafer may be aligned at a location remote from the mounting of its individual flip chips on a corresponding substrate or circuit board.

SUMMARY OF THE INVENTION

In accordance with the teachings of the present invention, a vertical wafer flip chip feeder device is provided for receiving a flip chip wafer having first and second planar surfaces and a plurality of individual flip chips formed within the first planar surface. Similarly, each of the flip chips have first and second planar surfaces that correspond to the first and second planar surfaces of the flip chip wafer. The flip chip feeder removes the individual flip chips from the flip chip wafer and presents them in a flipped position. In addition, a technique for retrieving flip chips from a flip chip wafer and for presenting the flip chips to a flip chip placement assembly is also taught.

In accordance with the teachings of one embodiment, the flip chip feeder device includes a loading station for providing a loading location where the flip chip wafer is received with the first and second planar surfaces being substantially perpendicular to a first plane. The flip chip feeder further includes a pick-up station for providing a pick-up location where the individual flip chips are retrieved from the flip chip wafer. A wafer translating assembly translates the flip chip wafer between the loading and pick-up stations with the first and second planar surfaces of the flip chip wafer remaining substantially perpendicular to the first plane. A chip pick-up assembly retrieves the individual flip chips from the flip chip wafer at the pick-up station and flips the individual flip chips to a flipped position such that the first and second planar surfaces of the flip chips are substantially parallel with the first plane.

According to a preferred embodiment, the wafer translating assembly includes a motorized rotary arm assembly that rotates the flip chip wafer with a second plane that is substantially perpendicular with the first plate.

Also in accordance with a preferred embodiment, the chip pick-up assembly includes an actuated slide assembly upon which a pick and place head assembly moves between a first end terminating at the pick-up station and a second end terminating at a transfer station. The pick and place head assembly is rotatable about an axis of the slide assembly between a chip presentation position and a chip retrieval position. The pick and place head assembly includes a vacuum tip member for retrieving the individual flip chips when the pick and place head assembly is rotated to the chip retrieval position and thereafter for securing the individual flip chips in the flipped position when rotated to the chip presentation position. In addition, the pick and place head assembly transfers the individual flip chips to the second end of the slide assembly for presentation to a chip placement assembly.

Use of the present invention provides a compact flip chip feeder device for directly retrieving flip chips from a vertically oriented flip chip wafer. As a result, the aforementioned disadvantages associated with current flip chip feeder devices have been substantially eliminated.

BRIEF DESCRIPTION OF THE DRAWINGS

Other objects and advantages of the present invention will become apparent to those skilled in the art upon reading the following detailed description and upon reference to the drawings in which:

FIG. 9 is a cutaway back view of the vertical wafer flip chip feeder in a non-rotated position with an empty expansion ring;

FIG. 10 is a cutaway front view of the vertical wafer flip chip feeder in a fully rotated position with an empty expansion ring;

DETAILED DESCRIPTION OF THE PREFERRED EMBODIMENTS

Figure 1:
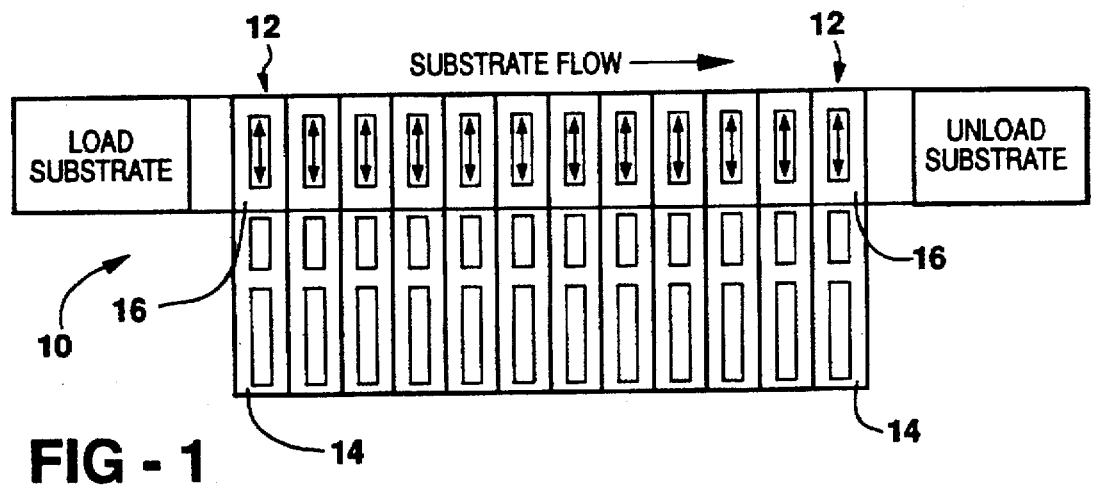
FIG. 1 illustrates a prior art flip chip surface mounting assembly employing multiple placement assemblies for mounting flip chip integrated circuit components to a substrate.

Referring to FIG. 1, a prior art integrated circuit mounting assembly 10 is illustrated. The mounting assembly 10 transports substrates (not shown) upon which flip chip integrated circuits are to be mounted past multiple flip chip mounting stations 12. Each of the mounting stations 12 are equipped with a flip chip feeder device 14 and mounting assembly 16. By way of example, the flip chip feeder devices 14 may be reel type feeder devices which utilize a feeder tape upon which individual flip chips have been individually located. The flip chip feeder devices 14 feed the individual flip chips to the mounting assemblies 16. The mounting assemblies 16 flip the individual flip chips such that the front faces of the flip chips on which contacts or bumps are formed contact a substrate. Byway of example, the mounting assemblies 16 may include a vacuum tip member which is attached to a flip arm for transporting the flip chips from a flip chip feeder device 14 to a substrate. It is common for each of the flip chip feeder devices 14 to feed different types of flip chips having a specific integrated circuit formed therein. Therefore, as the substrates are transported past the flip chip mounting stations 12, the respective flip chips are mounted upon the substrates. Accurate alignment of the individual flip chips upon the substrate is critical due to the large number and reduced size of the contact pads or bumps formed on the front faces of the individual flip chips. A problem with the mounting assembly 10 is that it consumes vast amounts of space which makes its use inefficient and costly.

Figure 2:
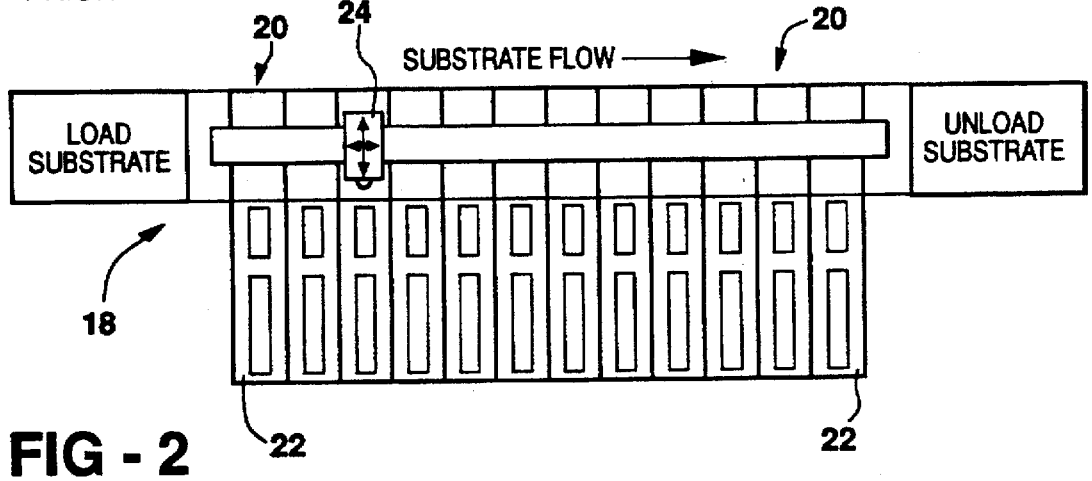
FIG. 2 illustrates a prior art flip chip surface mounting assembly employing a single pick and place type placement assembly that obtains flip chip integrated circuits from multiple reel type feeder stations.

Turning to FIG. 2, another prior art flip chip integrated circuit mounting assembly 18 is illustrated. As with the mounting assembly 10 of FIG. 1, mounting assembly 18 includes multiple flip chip mounting stations 20 which include a corresponding number of flip chip feeder devices 22. Again, the feeder devices may be of the real type. However, the multiple mounting assemblies 16 employed in mounting assembly 10 have been replaced by a single pick and place type mounting assembly 24 which travels in directions parallel and perpendicular to the substrate flow. As with the mounting assembly 10, mounting assembly 18 is large in size and consumes vast amounts of space. It is important to note that both flip chip feeder devices 14 and 22 can provide vertical and horizontal alignment of the individual flip chips but do not provide for radial alignment.

Figure 3:
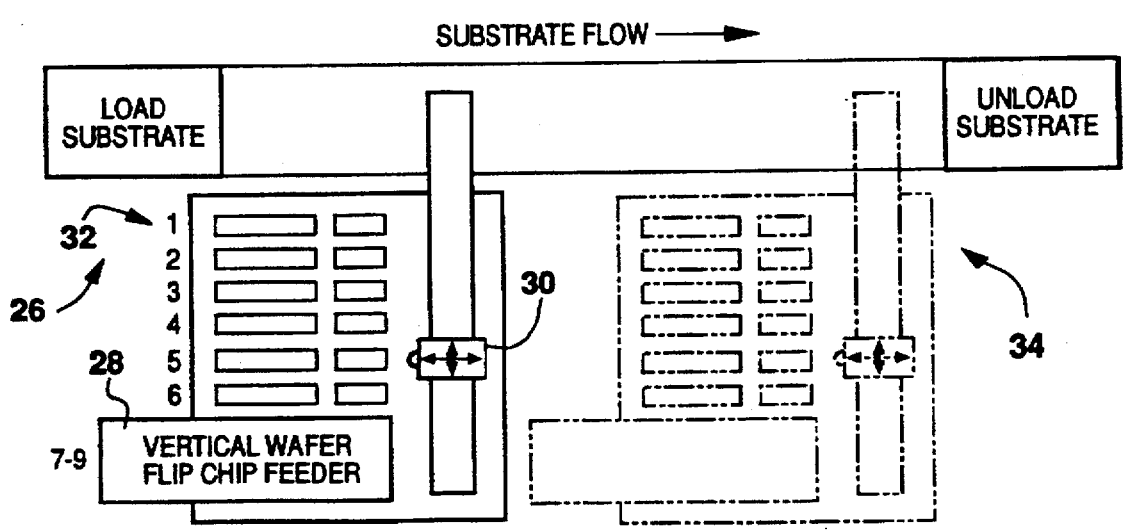
FIG. 3 illustrates an existing surface mounting assembly having a single maneuverable pick and place type placement assembly that obtains flip chips from the vertical wafer flip chip feeder in accordance with the present invention.

Next turning to FIG. 3, a flip chip mounting assembly 26 employing a vertical wafer flip chip feeder 28 in accordance the present invention is illustrated. The mounting assembly 26 includes a pick and place type placement assembly 30 that is movable between a plurality of flip chip mounting stations 32. The vertical wafer flip chip feeder 28 is employed within existing mounting stations 32. In order to maximize space, the flip chip mounting stations 32 are oriented parallel to the substrate flow of the flip chip mounting assembly 26. The placement assembly 30 is movable in directions parallel and perpendicular to the substrate flow. The placement assembly 30 retrieves individual flip chips from the vertical wafer flip chip feeder 28 and transports them to a substrate from the substrate flow (not shown). As illustrated by hidden lines, an additional flip chip mounting assembly 34 may be utilized adjacent to the mounting assembly 26 for mounting additional flip chips to a common or an additional substrate.

Figure 4:
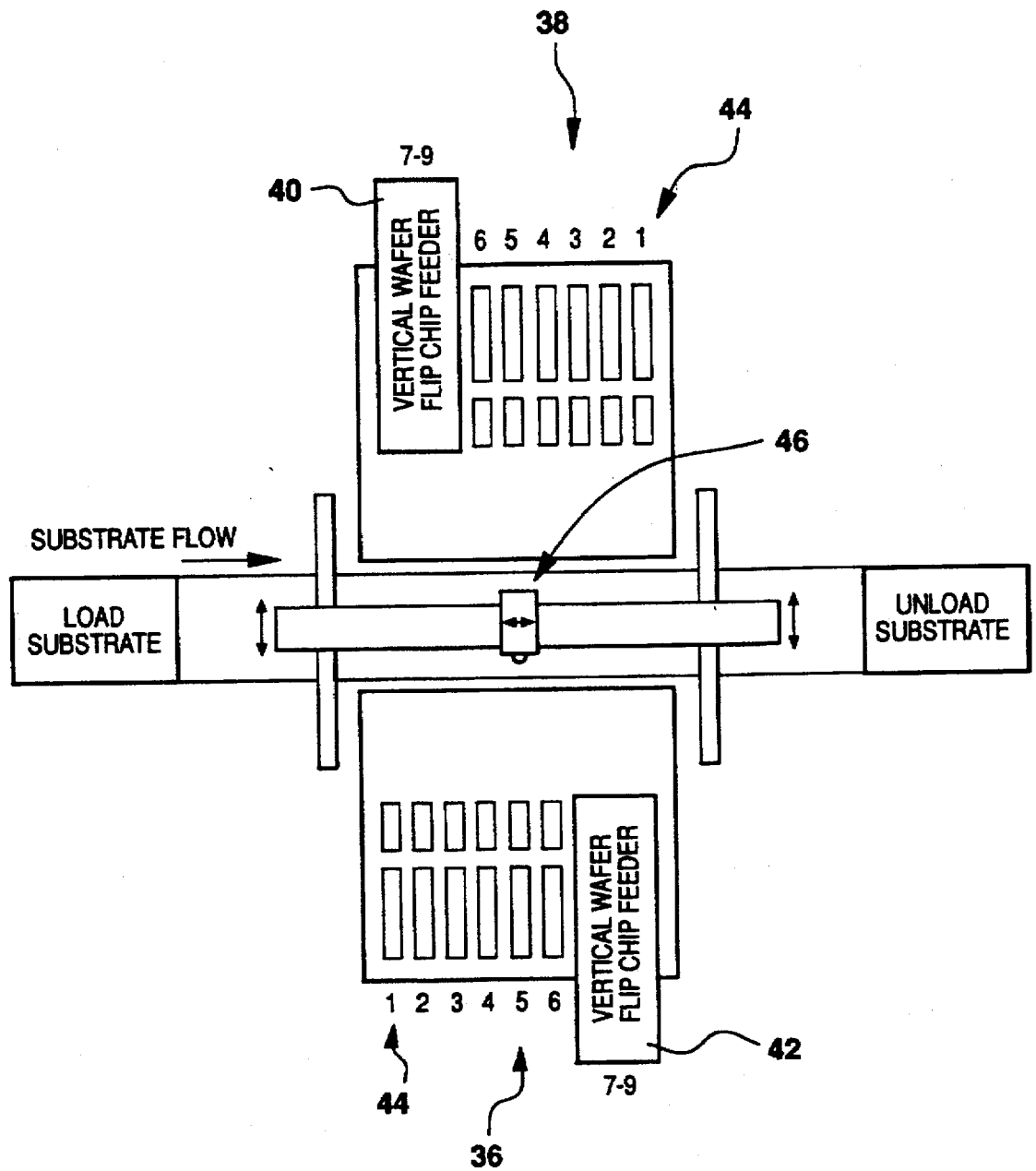
FIG. 4 illustrates another existing surface mounting assembly employing a single maneuverable pick and place type placement assembly that obtains flip chips from pair of vertical wafer flip chip feeders in accordance with the present invention.

Turning to FIG. 4, flip chip mounting assemblies 36 and 38 employing vertical wafer flip chip feeders 40 and 42 in accordance with the present invention are illustrated. Again, the mounting assemblies 36 and 38 employ mounting stations 44 that are oriented parallel to the indicated substrate flow. However, the mounting stations 44 are now located on either side of the substrate flow. According to this configuration, a single pick and place type placement assembly 46 is utilized for retrieving flip chips from the flip chip feeders 40 and 42 for mounting the individual flip chips to a substrate from the substrate flow (not shown).

Figure 5:
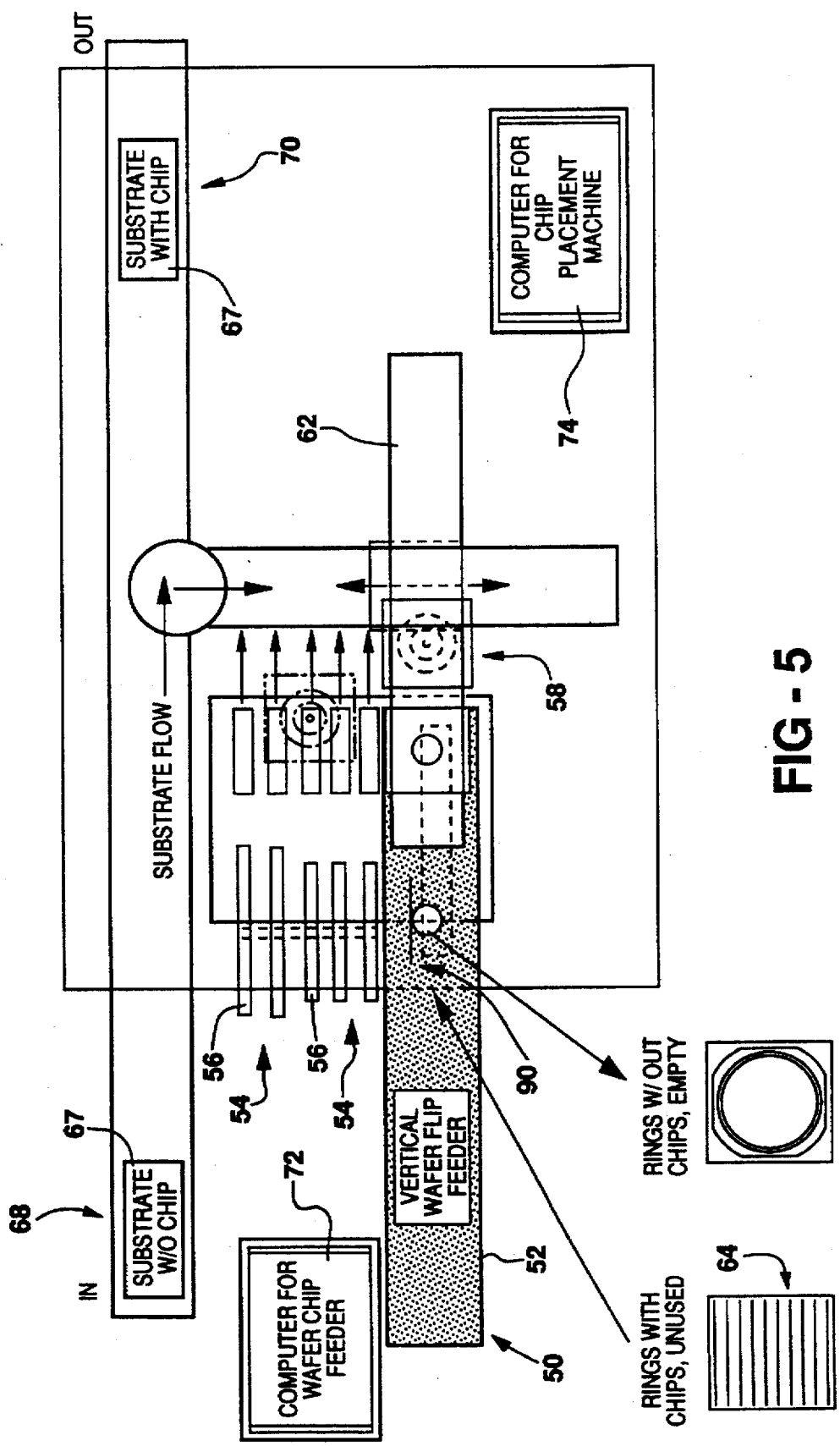
FIG. 5 is a top view illustration of the vertical wafer flip chip feeder used in conjunction with the existing surface mounting stations illustrated in FIG. 3.

Referring now to FIG. 5, an illustration of a top view of a flip chip mounting assembly 50 is shown having a configuration similar to the flip chip mounting assembly 26 of FIG. 3. The flip chip mounting assembly 50 includes a vertical wafer flip chip feeder 52 in accordance with the present invention. The flip chip feeder 52 is positioned adjacent to existing flip chip mounting stations 54. Each of the mounting stations 54 may employ additional flip chip feeder devices 56 for feeding individual flip chips to a pick and place type placement assembly 58. The placement assembly 58 is maneuvered by linear actuator 62 in a direction parallel with the substrate flow of the flip chip mounting assembly 50. Mounting stations 54 are in turn maneuvered in a direction perpendicular to the substrate flow. As shown by illustration, the flip chip feeder 52 may receive multiple expansion rings 64 containing sawed and expanded flip chip wafers at a loading station 90.

A suitable flip chip substrate 67 with integrated circuitry formed within its top surface enters the flip chip mounting assembly 50 at a location 68 and exits at a location 70 with individual flip chips mounted on its top surface. As will be explained in detail below, the placement assembly 58 retrieves individual flip chips from the flip chip feeder 52 in a flipped position wherein the faces of the flip chips within which contact pads are formed are facing away from the placement assembly 58. The placement assembly 58 then transports the flip chips to the substrate flow for mounting on the substrate 67. The vertical wafer flip chip feeder 52 is controlled by a suitable computer 72 that is integrated with a computer 74 that controls the placement of retrieved flip chips upon the substrate 67.

Figure 6:
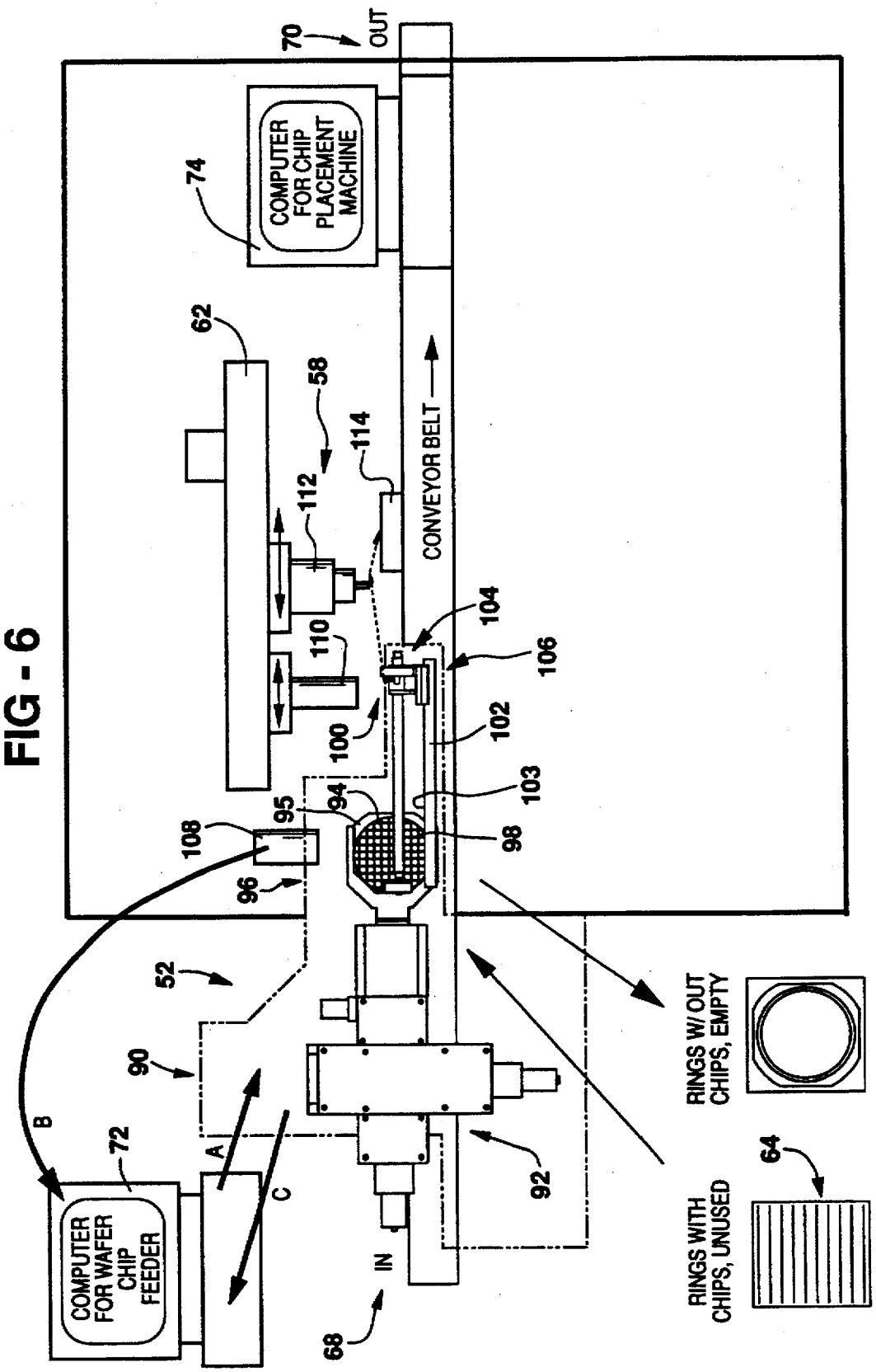
FIG. 6 is a cutaway side view of the flip chip mounting assembly illustrated in FIG. 5.

Next, FIG. 6 is a cutaway side view of the flip chip mounting assembly 50 of FIG. 5. The vertical wafer flip chip feeder 52 includes the loading station 90 where the expansion rings 64 containing expanded flip chip wafers are loaded and retrieved by a wafer translating assembly 92. As will be discussed in detail below, the wafer translating assembly 92 translates an expanded flip chip wafer 94 that is contained in an expansion ring 95 to a pick-up station 96. The flip chip wafer 94 includes individual flip chips 98. The vertical wafer flip chip feeder 52 includes a flip chip pick-up assembly 100 which includes an actuated slide member 102 and a pick and place head assembly 104 that moves horizontally between the pick-up station 96 and a transfer station 106. As will be described in detail below, the wafer translating assembly 92 translates the flip chip wafer 94 between the loading station 90 and the chip pick-up station 96 with the flip chip wafer 94 remaining substantially perpendicular to a first plane defined by a top surface 103 of the actuated slide member 102.

In operation, the computer 72 may monitor and calculate the position of the flip chip wafer 94 and the individual flip chips 98 as well as control the wafer translating assembly 92 through the use of a computer vision camera 108. The computer 72 transmits and receives information through data links illustrated by lines A–C. The flip chip wafer 94 is shown positioned at the pick-up station 96 such that the chip pick-up assembly 100 is maneuverable to remove the individual flip chips 98 from the flip chip wafer 94. The pick-up assembly 100 then transports the retrieved flip chips 98 to the transfer station 106 in a flipped position with the planar surfaces of the flip chips 98 being substantially parallel with the first plane defined by the top surface 103 of the actuated slide member 102. The placement assembly 58 is maneuvered by the linear actuator 62 and includes a computer vision camera 110 that may monitor and calculate the position of the flip chips 98 that have been retrieved by the pick and place head assembly 104. The placement assembly 58 includes a pick and place type head assembly 112 that retrieves the individual flip chips 98 from the head assembly 104. The computer 74 may monitor the alignment and placement of the individual flip chips 98 upon a substrate 114.

Figure 7:
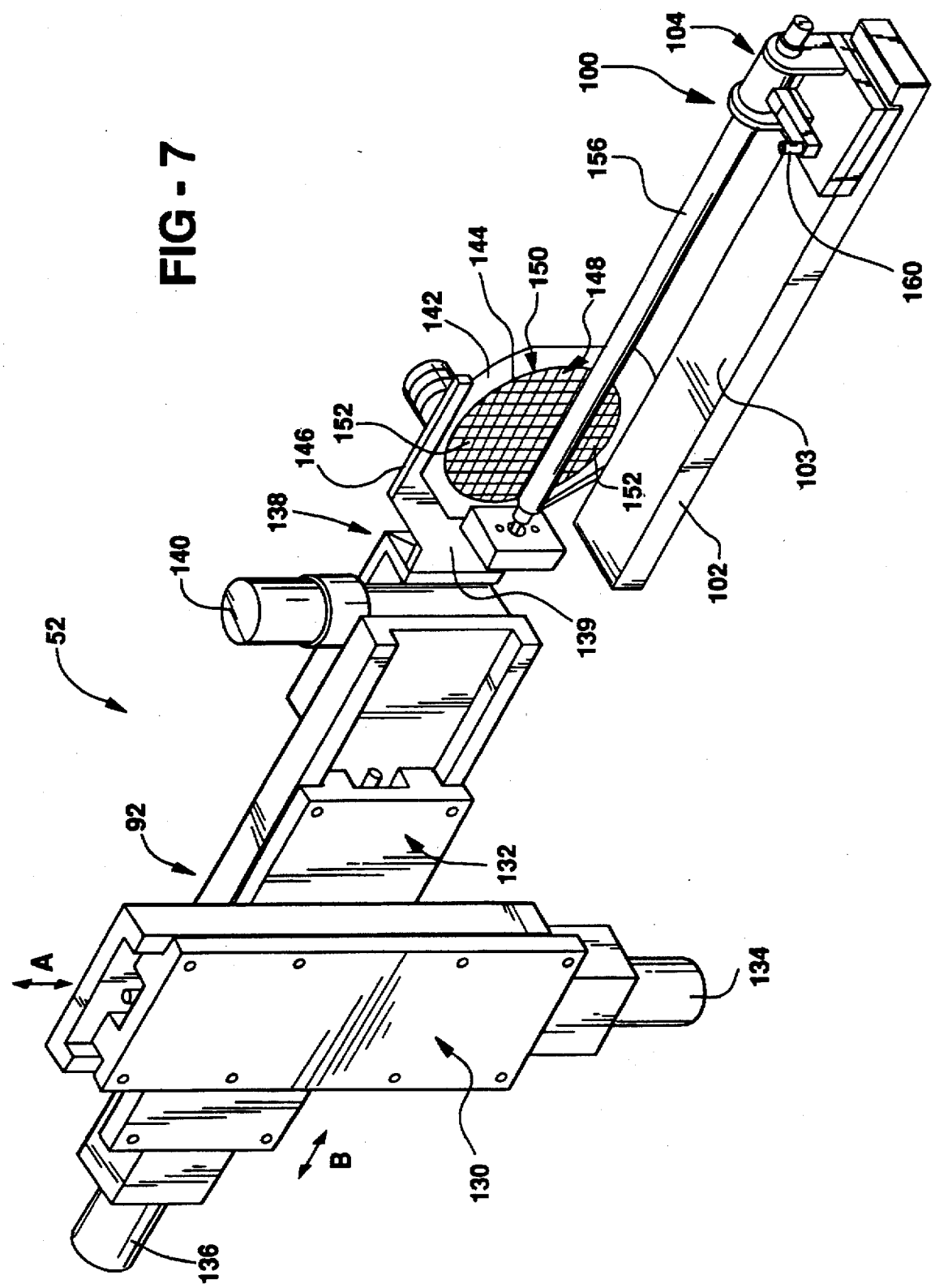
FIG. 7 is a cutaway perspective view of the vertical wafer flip chip feeder in accordance with the present invention.

Turning to FIG. 7, a cutaway perspective view of the preferred construction of the vertical wafer flip chip feeder 52 is shown. The wafer translating assembly 92 includes a vertical motorized table assembly 130 and a horizontal motorized table assembly 132. The vertical motorized table assembly 130 is driven by a first motor 134, and the horizontal motorized table assembly 132 is driven by a second motor 136. A motorized rotary arm assembly 138 is driven by a third motor 140. As will be apparent to one skilled in the art, motors 134, 136, and 140 may be stepper type motors, servo type motors, or any other suitable type of motors. The rotary arm assembly 138 includes a forked arm member 146 that receives and secures an expansion ring 142 containing an expanded flip chip wafer 144. The flip chip wafer 144 includes a first planer surface 148 and a second planer surface 150. A plurality of flip chips 152 are formed within the first surface 148, and each of the flip chips 152 include first and second planar surfaces corresponding to the first and second planar surfaces 148 and 150 of the flip chip wafer 144.

In operation the vertical motorized table assembly 130 moves in vertical directions between the loading station 90 (not on drawing) and the chip pick-up station 96 as indicated by arrow A and illustrated in FIG. 6. Similarly, the horizontal motorized table assembly 132 moves in horizontal directions between the loading station 90 (not shown in drawing) and the chip pick-up station 96 as indicated by arrow B. The rotary arm assembly 138 is rotatably coupled to the horizontal motorized table assembly 132 such that it is rotatable through a second plane defined by a front surface 139 of the forked arm member 146 and which is perpendicular to the first plane defined by the top surface 103 of the slide member 102. As will be apparent to one skilled in the art, such rotation allows for rotational alignment of the flip chip wafer 144 prior to removal of the individual flip chips 152.

The chip pick-up assembly 100 includes a spline bearing 156 that maneuvers the pick and place head assembly 104 about the slide member 102. As will be discussed in detail below, the pick and place head assembly 104 includes a vacuum tip member 160 which is coupled to a vacuum source (not shown) for retrieving the individual flip chips 152 from the flip chip wafer 144.

Figure 8:
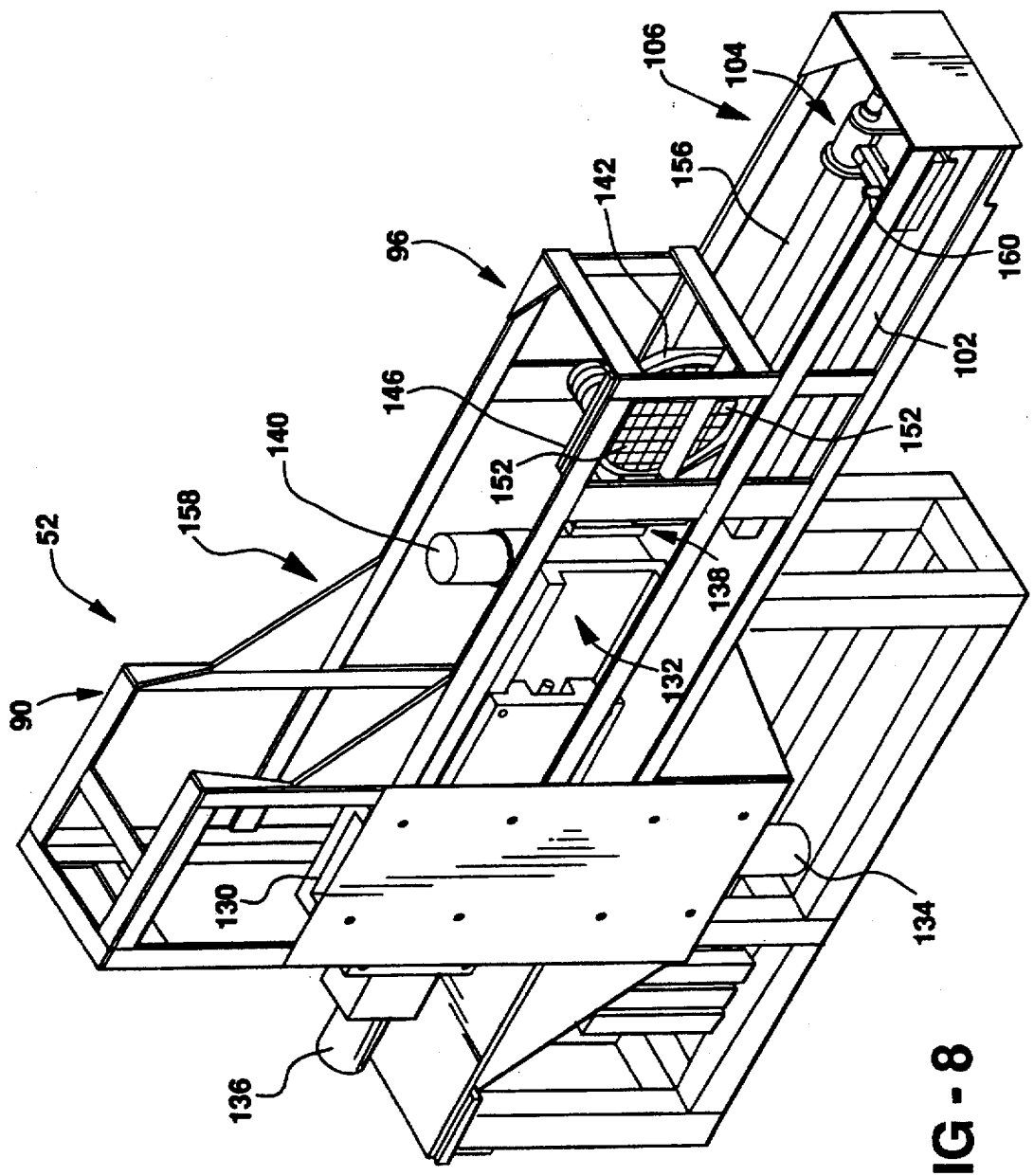
FIG. 8 is a full perspective view of the vertical flip chip feeder in accordance with a preferred embodiment of the present invention.

Turning to FIG. 8, a full perspective view of the vertical wafer flip chip feeder 52 is shown with the flip chip wafer 144 being aligned and positioned at the pick-up-station 96. The vertical wafer flip chip feeder 52 includes an outer structure 158 that supports and encloses the wafer translating assembly 92 and the chip pick-up assembly 100. Additionally, the outer structure 158 defines the loading station 90, the pick-up station 96 and the transfer station 106. As will be apparent to one skilled in the art, the vertical wafer flip chip feeder 52 has a narrow profile due to the ability to vertically align the flip chip wafer 144 at the loading station 90 and at the pick-up station 96 for removal of the individual flip chips 152. Additionally, the vertical wafer flip chip feeder 52 saves space by providing vertical, horizontal, and rotary alignment of the flip chip wafer 144 at a location remote from the corresponding flip chip placement assembly 58.

With reference to FIGS. 9–19, the method of retrieving the individual flip chips 152 from the expanded flip chip wafer 144 and for presenting the flip chips 152 to a suitable flip chip placement assembly will be discussed in detail. First turning to FIG. 9, a cutaway back view of the vertical wafer flip chip feeder 52 is shown. The rotary arm assembly 138 is in a non-rotated position with an empty expansion ring 154 located within the forked arm member 146. A mirror assembly 162 and a punch assembly 166 are illustrated and will be discussed in detail below.

Referring now to FIG. 10, a cutaway front view of the vertical wafer flip chip feeder 52 is shown. The rotary assembly 138 has been rotated approximately ninety (90_) degrees from the position shown in FIG. 9 to a fully rotated position. As will be apparent to one skilled in the art, the rotary arm assembly 138 rotates through the second plane defined by the front surface 139 of the forked arm member 146. As indicated above, this second plane is perpendicular to the first plane defined by the top surface 103 of the slide member 102.

Figure 11:
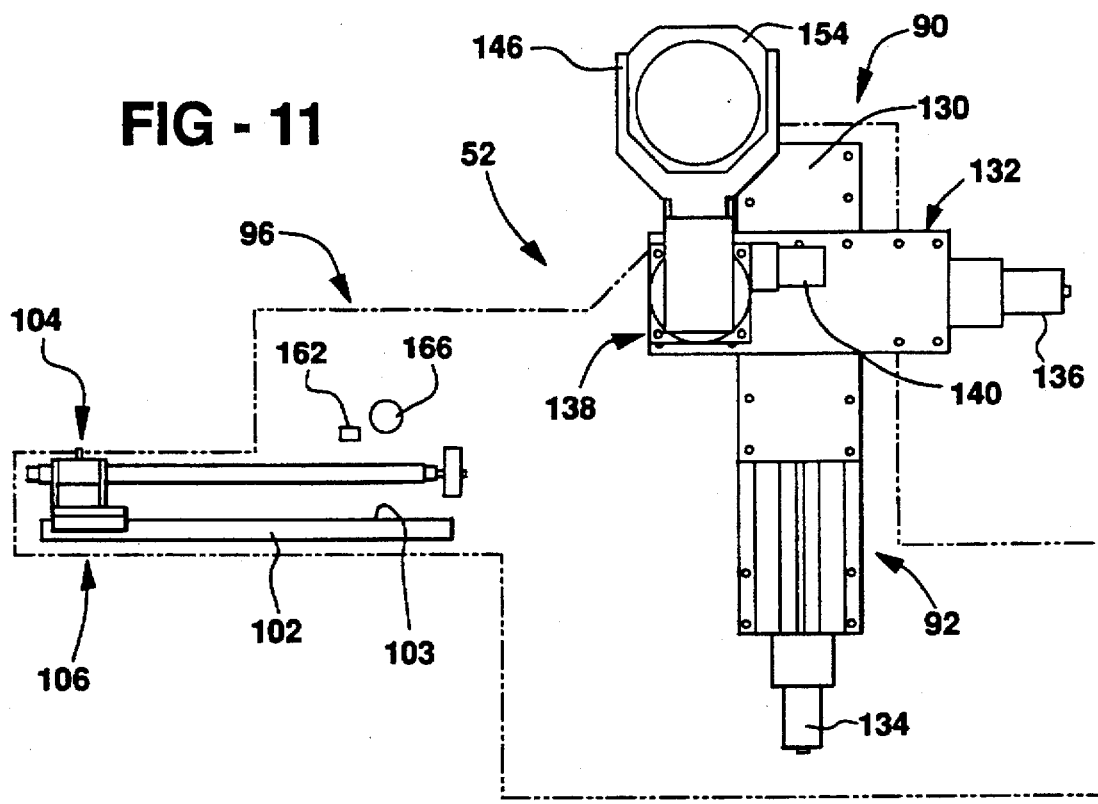
FIG. 11 is a cutaway back view of the vertical wafer flip chip feeder in a loading position.

Turning to FIG. 11, a cutaway back view of the vertical wafer flip chip feeder 52 is shown. The vertical motorized table assembly 130 has been moved in an upward vertical direction from the position shown in FIG. 10 to a loading position. At this position, the empty expansion ring 154 is located at the loading station 90 and may be replaced by another expansion ring containing an expanded flip chip wafer. It is important to note that the forked arm member 146 allows for an expansion ring containing an expanded flip chip wafer to be loaded in a vertical manner such that the planar surfaces of the wafer are substantially perpendicular to the first plane defined by the top surface 103 of the slide member 102. A gain, this orientation of a flip chip wafer saves space when compared to prior art feeder devices.

Figure 12:
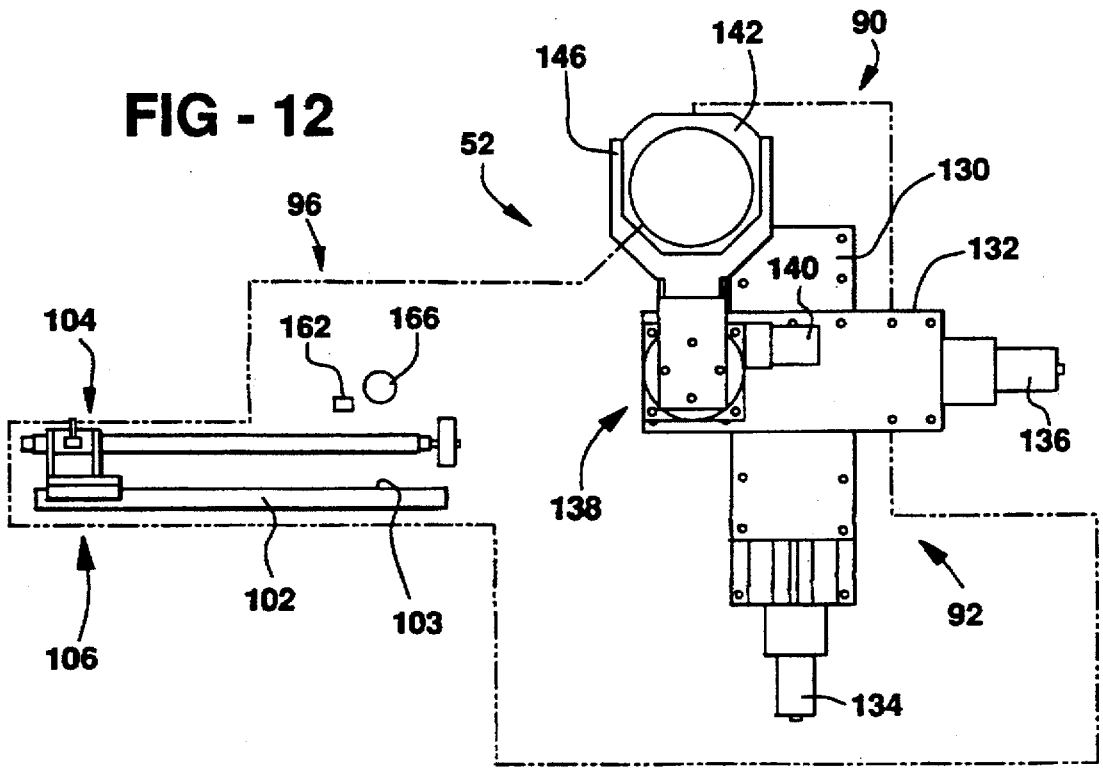
FIG. 12 is a cutaway back view of the vertical wafer flip chip feeder in an intermediate position.

Next turning to FIG. 12, a cutaway back view of the vertical wafer compact flip chip feeder 52 is shown after the vertical motorized table assembly 130 has moved in a downward vertical direction from the position shown in FIG. 11. The empty expansion ring 154 has been replaced by an expansion ring containing an expanded flip chip wafer such as the expansion ring 142 containing flip chip wafer 144 described in conjunction with FIG. 7.. From this view, the individual flip chips 152 are not visible. As will be apparent to one skilled in the art, the forked arm member 146 secures the expansion ring 142 such that the first and second planar surfaces 148 and 150 of the flip chip wafer 144 are perpendicular to the first plane defined by the top surface 103 of the slide member 102.

Figure 13:
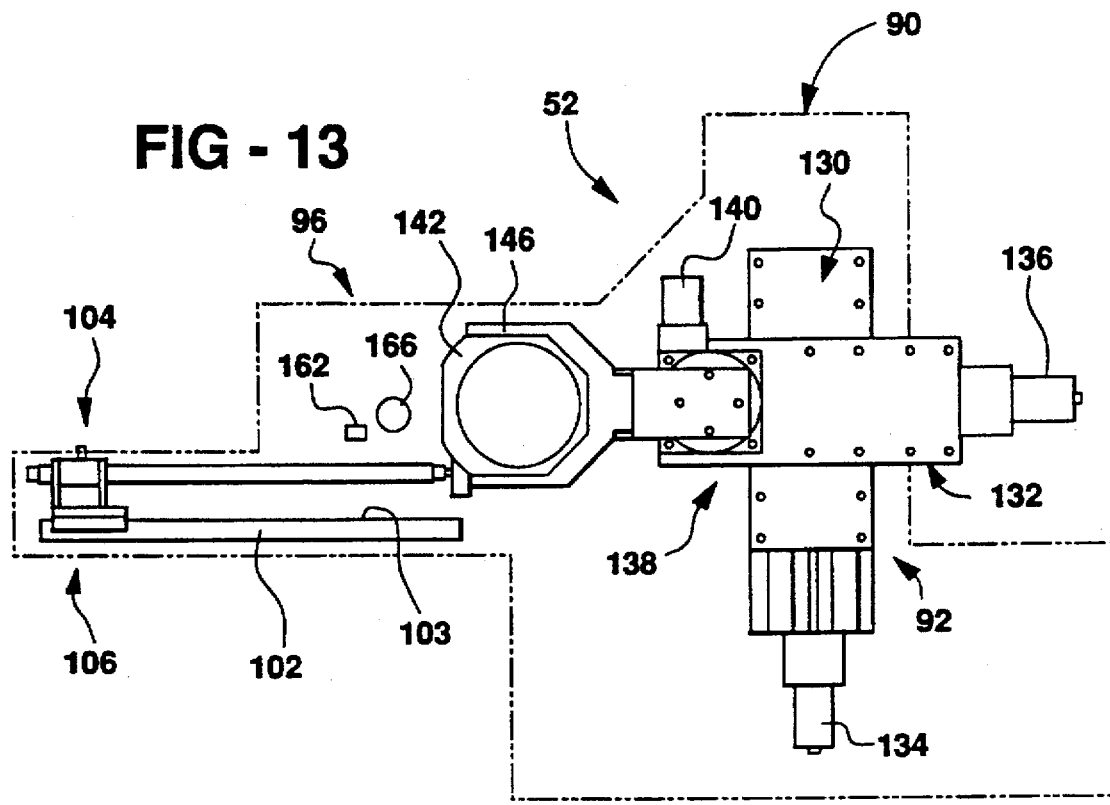
FIG. 13 is a cutaway back view of the vertical wafer flip chip feeder in the non-rotated position.

Next turning to FIG. 13, a cutaway back view of the vertical wafer compact flip chip feeder 52 is shown. The rotary arm assembly 138 has been rotated through the second plane back to the non-rotated position.

Figure 14:
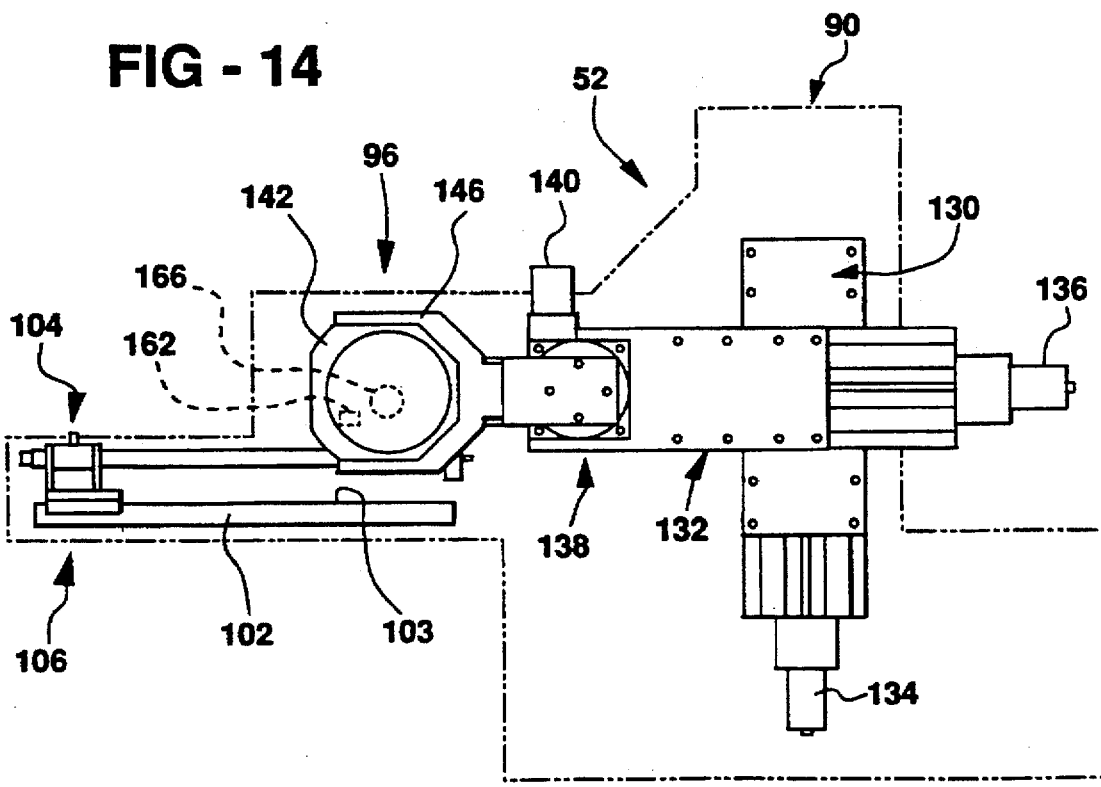
FIG. 14 is a cutaway back view of the vertical wafer flip chip feeder in an alignment position.

Turning to FIG. 14, the horizontal motorized table assembly 132 has been moved in a horizontal direction to the pick-up station 96. At this position, the expansion ring 142 and flip chip wafer 144 are located at the pick-up station 96 for alignment purposes.

Figure 15:
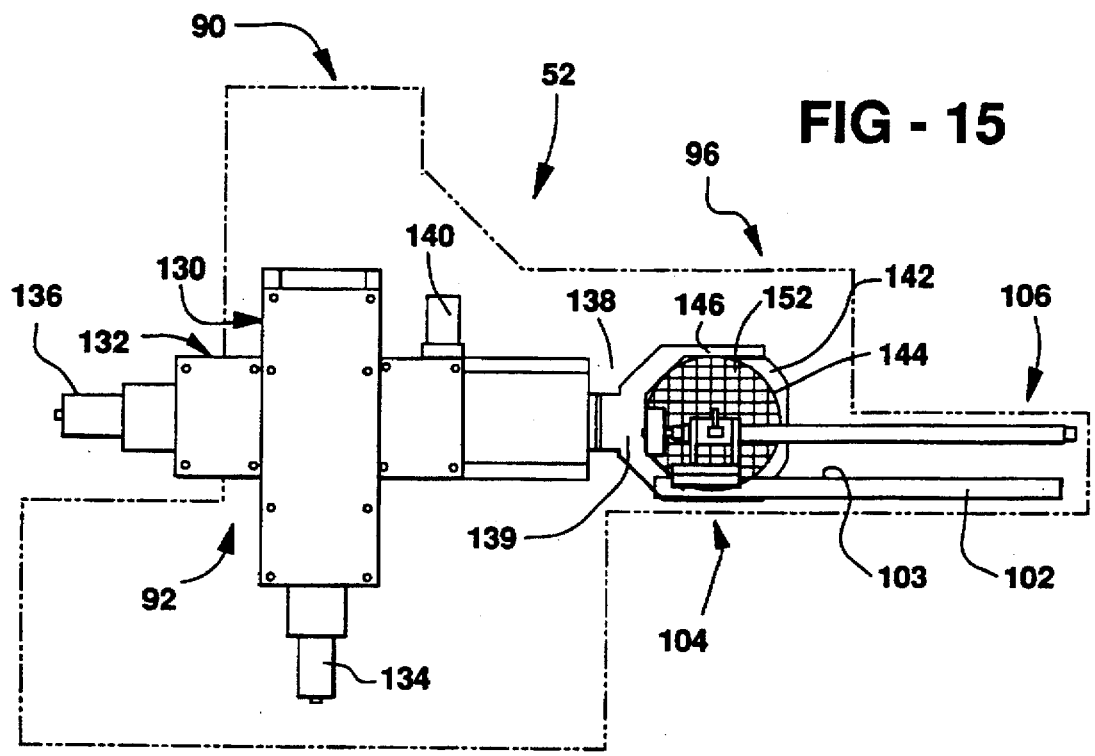
FIG. 15 is a cutaway front view of the vertical wafer flip chip feeder as shown.

Turning to FIG. 15, a cutaway front view of the vertical wafer flip chip feeder 52 is shown. The pick and place head assembly 104 has moved from the transfer station 106 to the pick-up station 96 about slide member 102 in preparation of retrieving the individual flip chips 152. It is important to note that the flip chip wafer 144 may be precisely aligned through movements of the motorized table assemblies 130 and 132 as well as the rotary arm assembly 138.

Figure 16:
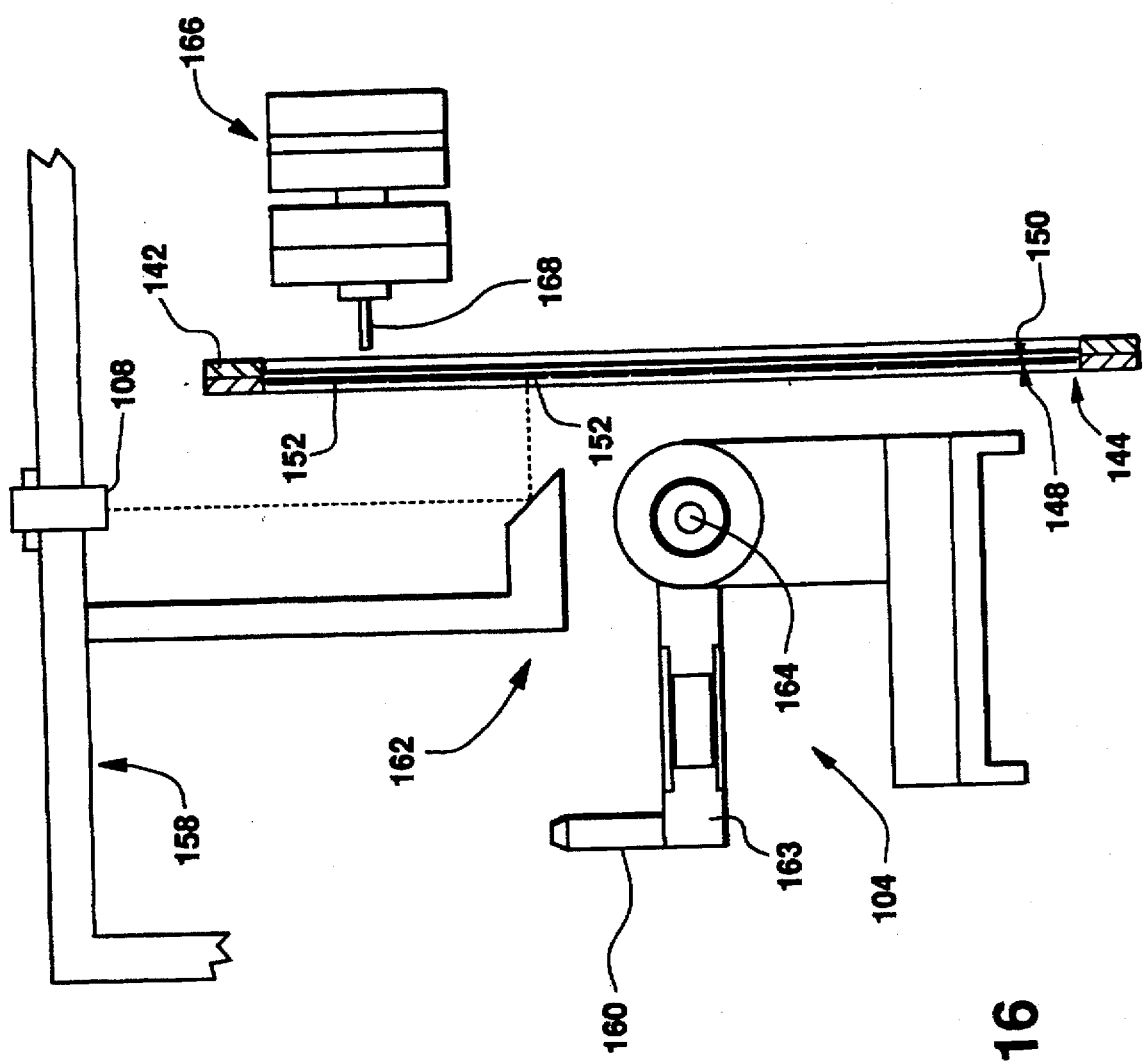
FIG. 16 is a cutaway view of FIG. 15 illustrating the alignment and viewing of an individual flip chip in accordance with the present invention.

Turning to FIG. 16, a cutaway view of FIG. 15 illustrating the alignment of the expansion ring 142 and the flip chip wafer 144 is shown. As illustrated by dashed lines, the mirror assembly 162 is used in conjunction with the computer vision camera 108 to align and determine the location of any of the individual flip chips 152. The camera 108 may be suspended from the outer structure 158 of the feeder 52 as illustrated. The camera 108 provides information to the previously discussed computers 72 and 74 such that the wafer translating assembly 92 may precisely align the flip chip wafer 144 at a desired position. As will be apparent to one skilled in the art, the camera 108 can determine the locations of the individual flip chips 152 which may be stored in a memory of the computer 72 or 74. This information may be subsequently used to retrieve individual flip chips 152 from the flip chip wafer 144 in a desired order. By way of example, the camera 108 may be used to determine the location of an individual flip chip 152 and the computer 72 or 74 may calculate the location of the remaining flip chips 152 due to the uniform expansion characteristics of a typical expansion ring.

With reference to the pick and place head assembly 104, an arm member 163 that supports the vacuum tip member 160 is rotatable about an axis 164 for retrieving the flip chips 152 from the flip chip wafer 144. The pick and place head assembly 104 is shown in a chip presentation position prior to rotation about the axis 164. Also illustrated is the punch assembly 166 that utilizes a pin member 168 for facilitating removal of the individual flip chips 152 from the flip chip wafer 144.

Figure 17:
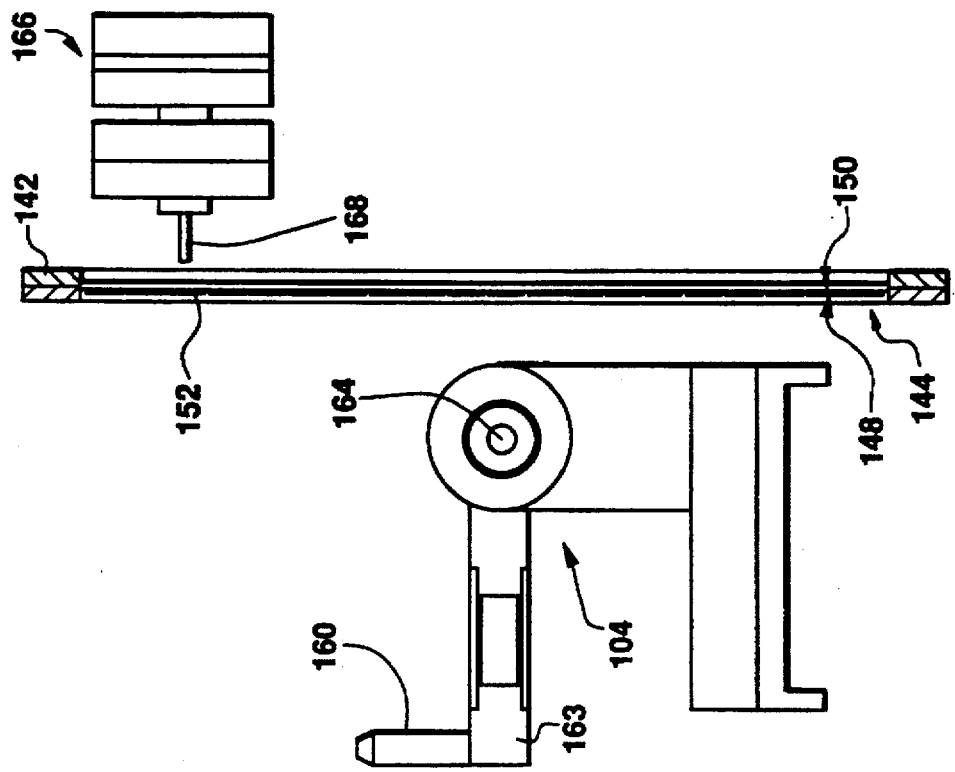
FIG. 17 illustrates the pick and place head assembly of the vertical wafer flip chip feeder in a chip presentation position.

Next turning to FIG. 17, the pick and place head assembly 104 is again shown in the chip presentation position prior to the arm member 163 being rotated about axis 164.

Figure 18A:
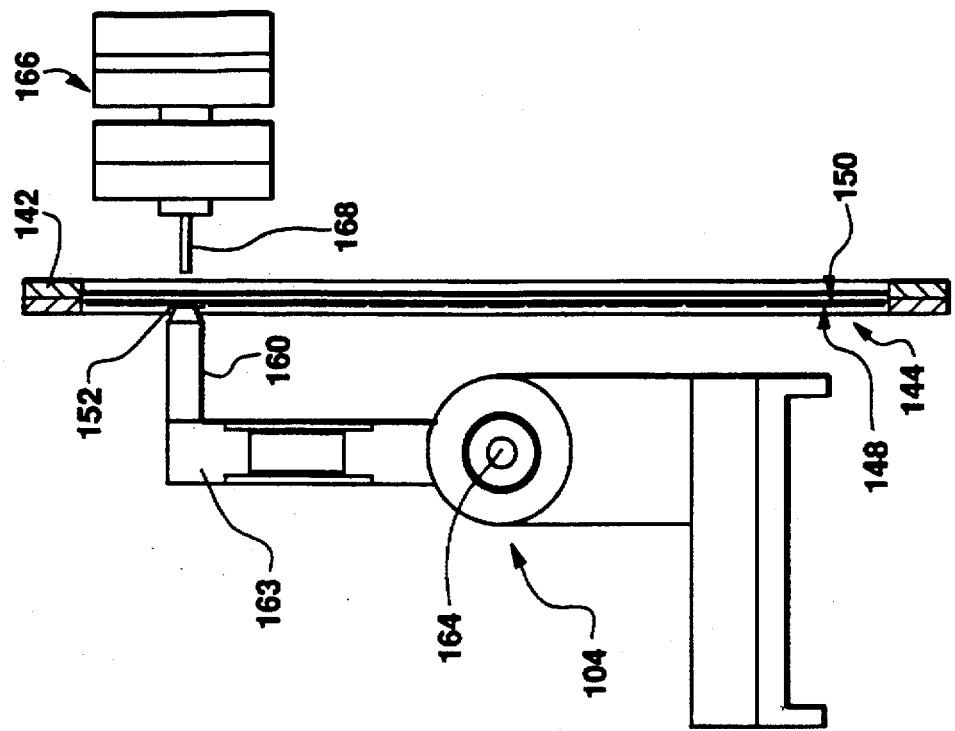
FIG. 18A illustrates the chip pick and place head assembly of the vertical wafer flip chip feeder in a chip retrieval position.

As shown in FIG. 18A, the pick and place head assembly 104 has been rotated about the axis 164 to a chip retrieval position such that the vacuum tip member 160 comes in contact with a desired individual flip chip 152 of the flip chip wafer 144.

Figure 18C:
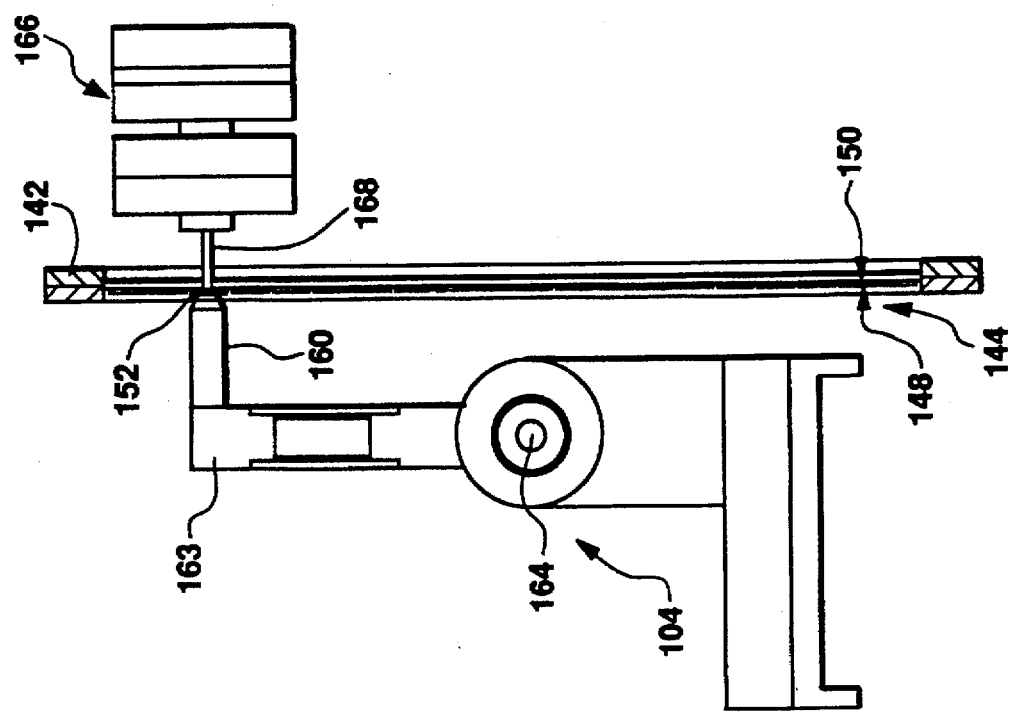
FIG. 18C illustrates the removal of an individual flip chip from a flip chip wafer by the pick and place head assembly of the vertical wafer flip chip feeder.
Figure 18B:
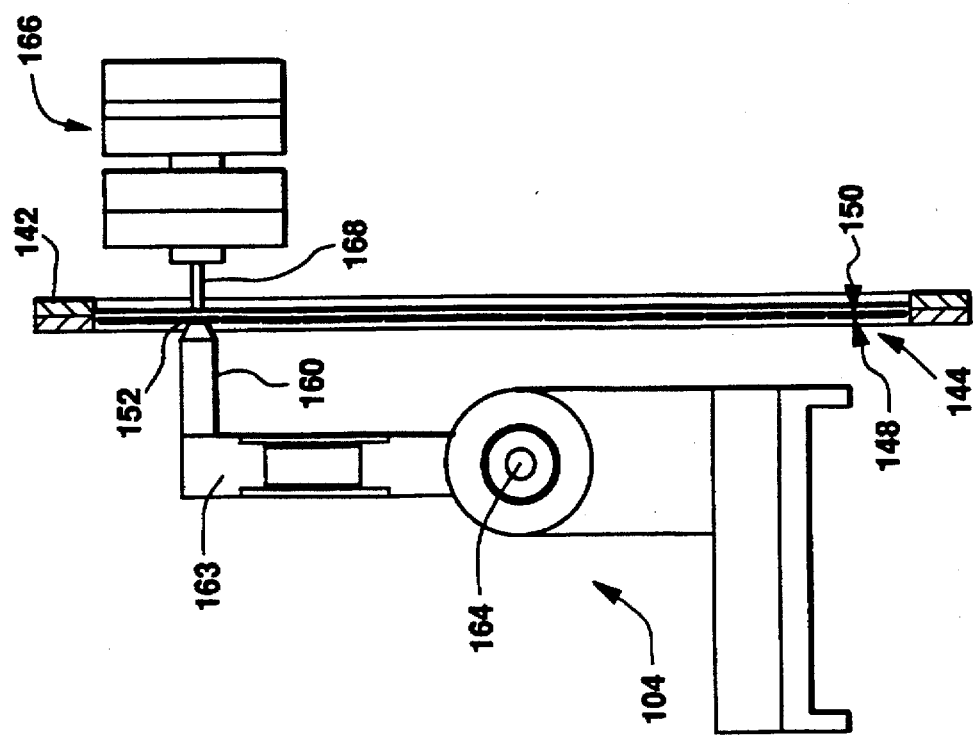
FIG. 18B illustrates the movement of a punch assembly of the vertical wafer flip chip feeder.

As illustrated in FIG. 18B, the pin member 168 of the punch assembly 166 is actuated towards the second planar surface 150 of the flip chip wafer and a corresponding second planar surface of an individual flip chip 152.

Turning to FIG. 18C, the punch assembly 166 is shown after the pin member 168 has been actuated such that the pin member 168 contacts and pushes the individual flip chip 152 towards the vacuum tip member 160. The individual flip chip 152 is now secured to the vacuum tip member 160 such that the arm member 163 may be rotated back about axis 164 to the chip presentation position. In effect, the individual flip chip 152 is flipped such that the first and second planar surfaces of the individual flip chip 152, corresponding to the first and second planar surfaces 148 and 150 of the flip chip wafer 144, are positioned parallel to the first plane defined by the top surface 103.

Figure 19:
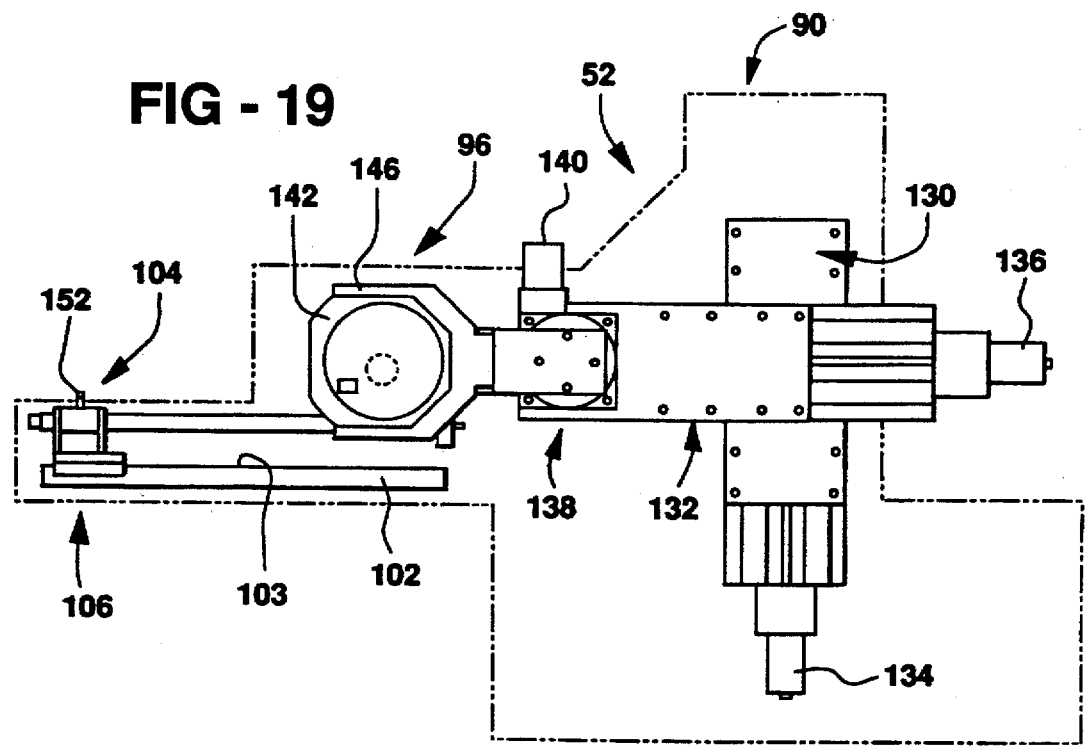
FIG. 19 is a cutaway back view of the vertical wafer flip chip feeder after an individual flip chip has been flipped and transferred to the transfer station for mounting purposes.

Lastly, referring to FIG. 19, a back view of the vertical wafer compact flip chip feeder 52 is shown. The retrieved flip chip 152 from. FIG. 18C has been flipped and the pick and place head assembly 104 has transferred the flip chip 152 to the transfer station 106. As will be apparent to one skilled in the art, a suitable flip chip placement assembly such as the placement assembly 58 illustrated in FIG. 6 may retrieve the individual flip chip 152 from the transfer station 106 for mounting to a suitable substrate.

From the foregoing, it can be seen that the use of the vertical wafer flip chip feeder 52 in conjunction with an existing flip chip mounting assembly has several useful consequences. Compared to prior art flip chip feeder devices, the vertical wafer flip chip feeder 52 requires less space to provide the flipping action required to present individual flip chips to a flip chip placement assembly. Additionally, the vertical wafer flip chip feeder 52 provides for the removal of individual flip chips directly from a flip chip wafer which may be aligned at a location remote from the mounting of the individual flip chips on a corresponding substrate or circuit board.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A flip chip feeder device for receiving and feeding at least one flip chip wafer having a first planar surface and a second planar surface, said flip chip wafer having a plurality of flip chips formed within said first planar surface, each of said flip chips having a first and a second planar surface corresponding to said first and said second planar surfaces of said at least one flip chip wafer, comprising:

a loading station for providing a loading location where said at least one flip chip wafer is received with said first and said second planar surfaces being substantially perpendicular to a first plane;

a pick-up station for providing a pick-up location where at least one of said flip chips is retrieved from said at least one flip chip wafer;

wafer translating means for translating said at least one flip chip wafer between said loading station and said pick-up station with said first and said second planar surfaces of said at least one flip chip wafer remaining substantially perpendicular to said first plane; and chip pick-up means for retrieving a first of said flip chips from said at least one flip chip wafer at said pick-up station and for flipping said first flip chip to a flipped position such that said first and said second planar surfaces of said first flip chip are substantially parallel with said first plane.

2. The flip chip feeder of claim 1 wherein said wafer translating means translates said at least one flip chip wafer in a vertical direction within a second plane being substantially perpendicular with said first plane.

3. The flip chip feeder of claim 1 wherein said wafer translating means translates said at least one flip chip wafer in a horizontal direction within a second plane being substantially perpendicular with said first plane.

4. The flip chip feeder of claim 1 wherein said wafer translating means translates said at least one flip chip wafer in a vertical direction and in a horizontal direction within a second plane being substantially perpendicular with said first plane.

5. The flip chip feeder of claim 1 wherein said wafer translating means rotates said at least one flip chip wafer in a second plane being substantially perpendicular with said first plane.

6. The flip chip feeder of claim 5 wherein said wafer translating means includes:

a motorized rotary arm assembly for receiving and rotating said at least one flip chip wafer in said second plane.

7. The flip chip feeder of claim 1 wherein said wafer translating means includes:

a first motorized table assembly for moving in a vertical direction between said loading station and said pick-up station;

a second motorized table assembly, coupled to said first table assembly, for moving in a horizontal direction between said loading station and said pick-up station, said second motorized table assembly moving in said vertical direction in response to movements of said first motorized table assembly; and a motorized rotary arm assembly, rotatively coupled to said second table assembly, for receiving said at least one flip chip wafer such that said first and said second planar surfaces remain substantially perpendicular to said first plane, said rotary arm assembly rotating in a second plane being substantially perpendicular with said first plane.

8. The flip chip feeder of claim 1 further comprising:

computer vision means for determining a location of at least one of said flip chips prior to said chip pick-up means retrieving and flipping said first flip chip.

9. The flip chip feeder of claim 1 wherein said chip pick-up means further delivers said first flip chip in said flipped position to a flip chip placement assembly for mounting said first flip chip to a substrate.

10. The flip chip feeder of claim 1 wherein said chip pick-up means includes:

an actuated slide assembly having a first end terminating at said pick-up station and a second end terminating at a transfer station; and a pick and place head assembly coupled to said slide assembly for moving between said first and said second ends of said slide assembly, said pick and place head assembly being rotatable about an axis of said slide assembly between a chip presentation position and a chip retrieval position, said pick and place head assembly including a vacuum tip member for retrieving said first flip chip when said pick and place head assembly is rotated to said chip retrieval position and thereafter for securing said first flip chip in said flipped position when said pick and place head assembly is rotated to said chip presentation position, whereby said pick and place head assembly transfers said first flip chip to said second end of said slide assembly.

11. The flip chip feeder of claim 10 wherein said chip pick-up means further includes a punch assembly for contacting said second planar surface of said first flip chip such that when said pick and place head assembly is rotated to said chip retrieval position, said first flip chip contacts said vacuum tip member.

12. A flip chip mounting assembly for mounting flip chips retrieved from at least one flip chip wafer to a substrate, said at least one flip chip wafer having a first planar surface and a second planar surface, said flip chip wafer having a plurality of said flip chips formed within said first planar surface, each of said flip chips having a first and a second planar surface corresponding to said first and said second planar surfaces of said at least one flip chip wafer, comprising:

a flip chip feeder device for receiving and feeding said at least one flip chip wafer, said flip chip feeder device including a loading station for providing a loading location where said at least one flip chip wafer is received with said first and said second planar surfaces being substantially perpendicular to a first plane, a pick-up station for providing a pick-up location where at least one of said flip chips is retrieved from said at least one flip chip wafer, wafer translating means for translating said at least one flip chip wafer between said loading station and said pick-up station with said first and said second planar surfaces of said at least one flip chip wafer remaining substantially perpendicular to said first plane, and chip pick-up means for retrieving a first of said flip chips from said at least one flip chip wafer at said pick-up station and for flipping said first flip chip to a flipped position such that said first and said second planar surfaces of said first flip chip are substantially parallel with said first plane, said chip pick-up means further delivers said first flip chip in said flipped position to a chip transfer station; and a flip chip placement means for retrieving said first flip chip at said chip transfer station and for mounting said first flip chip to said substrate.

13. The flip chip mounting assembly of claim 12 wherein said wafer translating means includes:

a first motorized table assembly for moving in a vertical direction between said loading station and said pick-up station;

a second motorized table assembly, coupled to said first table assembly, for moving in a horizontal direction between said loading station and said pick-up station, said second motorized table assembly moving in said vertical direction in response to movements of said first motorized table assembly; and a motorized rotary arm assembly, rotatively coupled to said second table assembly, for receiving said at least one flip chip wafer such that said first and said second planar surfaces remain substantially perpendicular to said first plane, said rotary arm assembly rotating in a second plane being substantially perpendicular to said first plane.

14. The flip chip mounting assembly of claim 12 wherein said chip pick-up means includes:

an actuated slide assembly having a first end terminating at said pick-up station and a second end terminating at said transfer station; and a pick and place head assembly coupled to said slide assembly for moving between said first and said second ends of said slide assembly, said pick and place head assembly being rotatable about an axis of said slide assembly between a chip presentation position and a chip retrieval position, said pick and place head assembly including a vacuum tip member for retrieving said first flip chip when said pick and place head assembly is rotated to said chip retrieval position and thereafter for securing said first flip chip in said flipped position when said pick and place head assembly is rotated to said chip presentation position, whereby said pick and place head assembly transfers said first flip chip to said second end of said slide assembly.

15. A method of retrieving a first flip chip from a flip chip wafer having a plurality of flip chips formed therein and presenting said first flip chip to a flip chip placement assembly, said flip chip wafer having a first planar surface and a second planar surface with said flip chips being formed within said first planar surface, each of said flip chips having a first and a second planar surface corresponding to said first and said second planar surfaces of said flip chip wafer, comprising the steps of:

orientating said flip chip wafer at a loading location such that said first and said second planar surfaces are substantially perpendicular to a first plane;

translating said flip chip wafer from said loading location within a second plane being substantially perpendicular to said first plane to a pick-up location;

retrieving said first flip chip from said flip chip wafer at said pick-up location; and flipping said first flip chip to a flipped position such that said first and said second planar surfaces of said first flip chip are substantially parallel with said first plane and presenting the flipped chip to flip chip placement assembly.

16. The method of claim 15 further comprising the step of:

determining the location of at least one of said flip chips prior to retrieving said first flip chip.

17. The method of claim 15 wherein said step of translating said flip chip wafer includes the step of:

translating said flip chip wafer in a vertical direction within said second plane.

18. The method of claim 15 wherein said step of translating said flip chip wafer includes the step of:

translating said flip chip wafer in a horizontal direction within said second plane.

19. The method of claim 15 wherein said step of translating said flip chip wafer includes the steps of:

translating said flip chip wafer in a vertical direction within said second plane; and translating said flip chip wafer in a horizontal direction within said second plane.

20. The method of claim 15 wherein said step of translating said flip chip wafer includes the step of:

rotating said flip chip wafer within said second plane.

* * * * *